United States Patent
Rehnelt et al.

[11] Patent Number: 6,072,235
[45] Date of Patent: Jun. 6, 2000

[54] TERMINAL ARRANGEMENT FOR AN SMD-CAPABLE HYBRID CIRCUIT

[75] Inventors: Karl Rehnelt, Munich; Frank Templin, Berlin, both of Germany

[73] Assignee: Siemens Aktiengesellschaft, Munich, Germany

[21] Appl. No.: 09/065,822

[22] Filed: Apr. 23, 1998

[30] Foreign Application Priority Data

Apr. 24, 1997 [DE] Germany ............................ 197 17 384

[51] Int. Cl.[7] .......................... H01L 23/02; H01L 23/495
[52] U.S. Cl. .......................... 257/697; 257/696; 257/732; 257/733; 361/784; 361/785
[58] Field of Search ................................... 257/697, 696, 257/732, 733; 361/277, 777, 751, 767, 801, 784, 785

[56] References Cited

U.S. PATENT DOCUMENTS

| | | | |
|---|---|---|---|
| 5,142,263 | 8/1992 | Childers | 338/21 |
| 5,661,339 | 8/1997 | Clayton | 257/768 |
| 5,751,553 | 5/1998 | Clayton | 361/749 |

FOREIGN PATENT DOCUMENTS

| | | | |
|---|---|---|---|
| 0 631 312 A1 | 12/1994 | European Pat. Off. | 257/296 |
| WO 94/03913 | 2/1994 | WIPO | 338/21 |
| WO 95/11523 | 4/1995 | WIPO | 257/723 |
| WO 96/13966 | 5/1996 | WIPO | 361/791 |

OTHER PUBLICATIONS

Patent Abstracts of Japan: No. 63–16650, Jan. 23, 1988.
Patent Abstracts of Japan: No. 4–243155, Aug. 31, 1992.
Patent Abstracts of Japan: No. 5–308114, Nov. 19, 1993.

*Primary Examiner*—Leo P. Picard
*Assistant Examiner*—Hung Van Duong
*Attorney, Agent, or Firm*—Hill & Simpson

[57] ABSTRACT

Terminal pins with two lateral portions and a bridge-shaped elevated middle portion are provided. The terminal pin and perpendicularly rising hybrid circuit typically together have an inverted T shape. On the one hand, the hybrid circuit stands on its own on the substrate without further means of assistance and can be soldered. On the other hand, the bridge-shaped construction effects a sufficient elasticity and carrying capacity relative to swivellings, or respectively, accelerations, as well as effecting the presence of two defined support surfaces whose co-planarity is guaranteed by the springing configuration of the terminal pins.

3 Claims, 2 Drawing Sheets

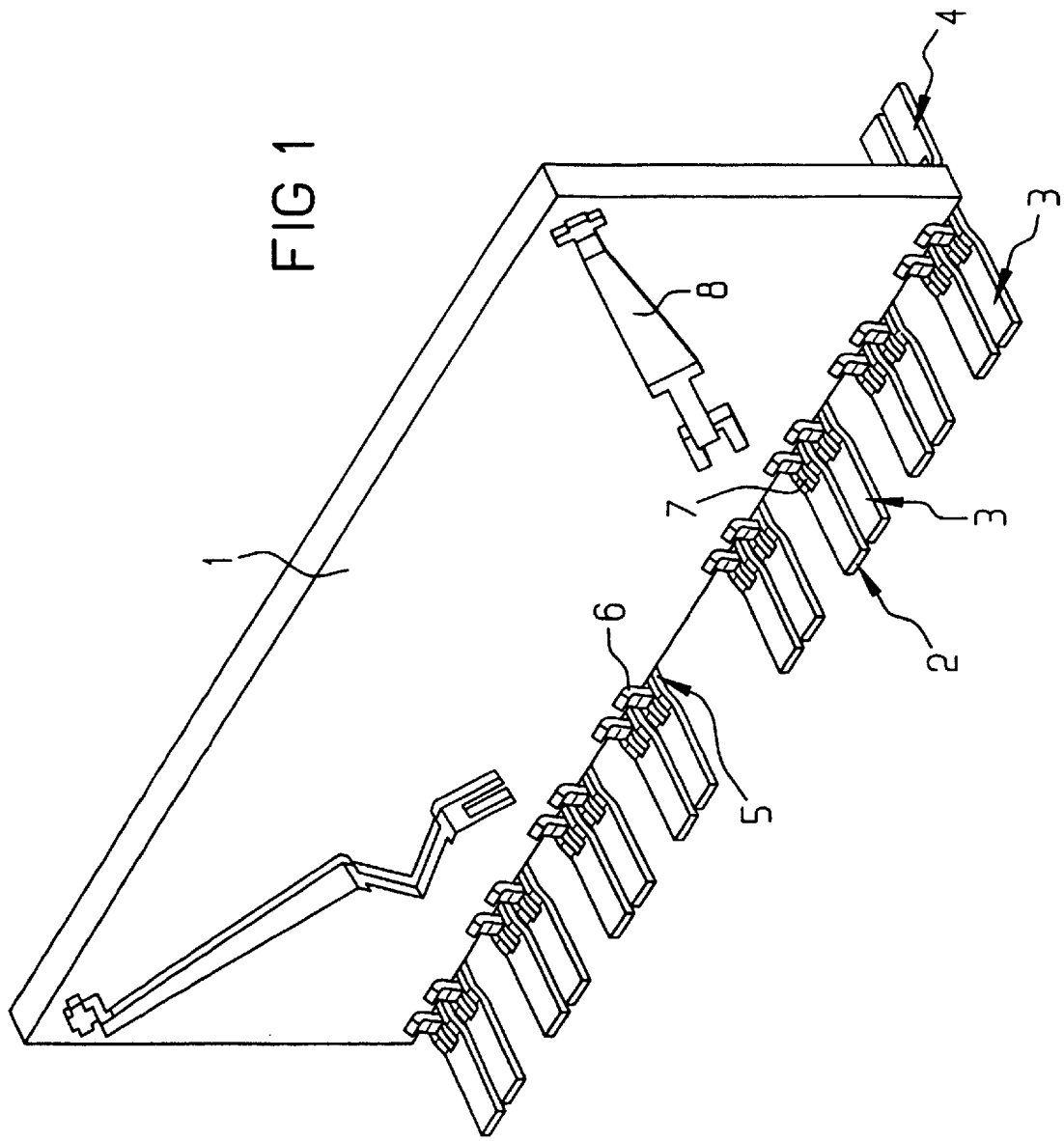

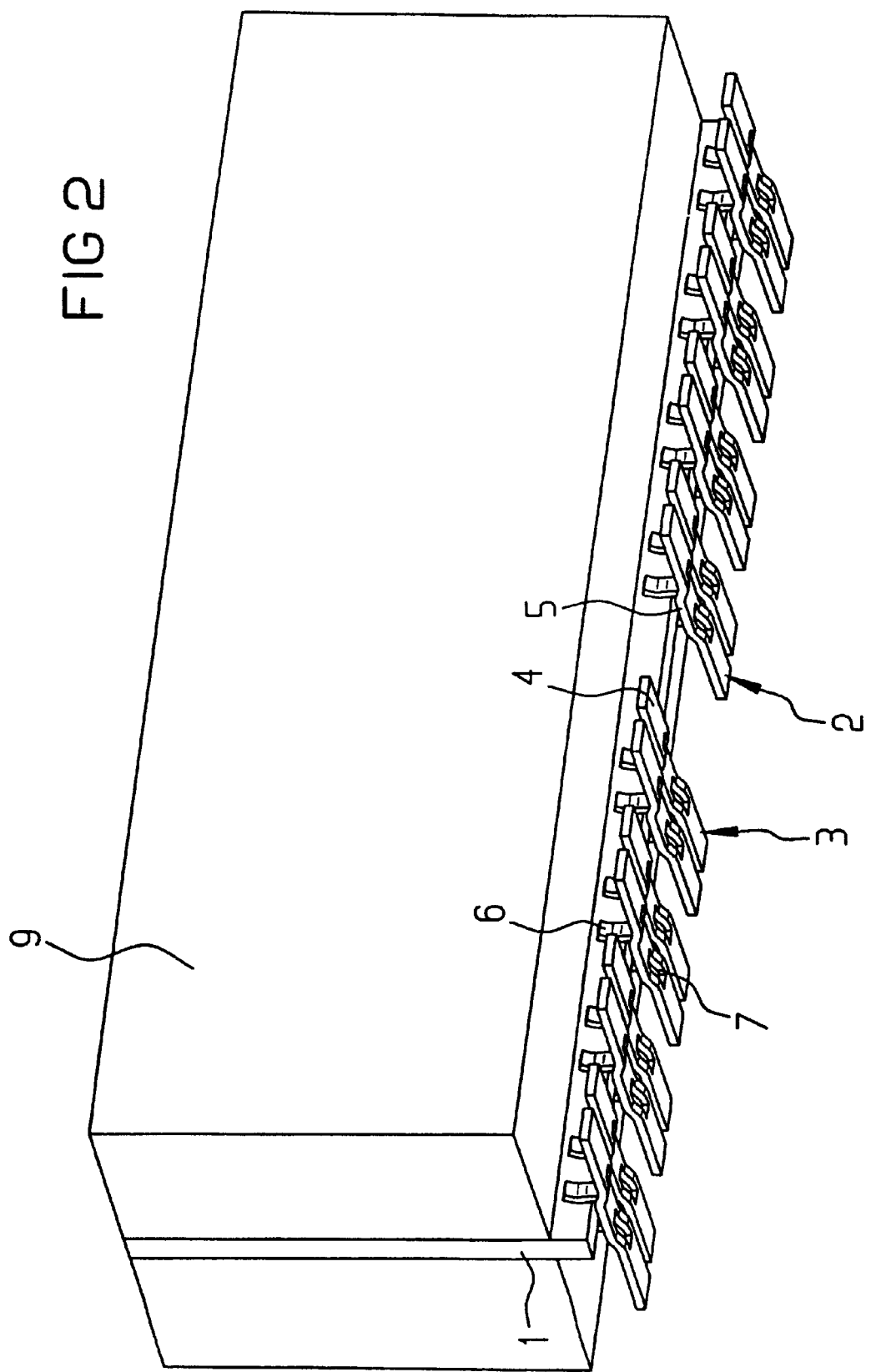

TERMINAL ARRANGEMENT FOR AN SMD-CAPABLE HYBRID CIRCUIT

BACKGROUND OF THE INVENTION

The present invention generally relates to a terminal arrangement for an SMD-capable hybrid circuit.

Hybrid or film circuits are electronic subassemblies in which planar interconnect structures and passive elements, especially resistors, are placed onto a ceramic substrate by means of a special film or layer technology. These planar structures are connected, or respectively, hybridized on the common ceramic substrate with other elements, e.g. IC's or relays. These other elements are commonly surface-assemblable; that is, in the known SMD (surface mounted devices) technology, they are placed onto terminal spots on the hybrid circuit and soldered there, mostly by reflow soldering.

In the course of lowering the production and assembly outlay in the production of printed circuit boards, a complete transition to surface assembly technology is desired. Therefore, the hybrid circuit as a whole should itself in turn be SMD-capable. To be sure, in order to obtain a high integration density, hybrid circuits today are mostly soldered in as single in-line subassemblies in printed circuit boards. In order to exploit the space provided in the third dimension, they are assembled perpendicular to the printed circuit board, or respectively, of the substrate, with only one row of terminals. However, to the present day, single in-line hybrid assemblies are connected with the mother board (substrate) exclusively by means of a plug-in assembly and are meanwhile nearly the last element which cannot be incorporated into SMD technology.

Problems in the realization of perpendicularly assembled SMD-capable hybrid assemblies lie primarily in the planarity requirement of the terminal pin, e.g. a co-planarity of 0.1 mm is required given a solder paste pressure of 0.15 mm in thickness but also in mechanical demands on the terminal pins with reference to swinging 9 or swivelling or pivoting and pushing stress in the device, particularly during transport. Besides this, from a design standpoint, the hybrid circuit itself must withstand the increased stresses in the SMD assembly, and this should not, of course, require any increased production outlay as far as possible, e.g. additional safety measures during soldering.

SUMMARY OF THE INVENTION

It is, therefore, an object of the present invention to provide a terminal arrangement for a single in-line assemblable, SMD-capable hybrid circuit.

To this end, the present invention provides a terminal arrangement with at least two essentially rectangularly planar terminal pins which are configured as metallic bent stamped parts. These pins have a portion constructed as a support surface at their two longitudinal ends, respectively. In the assembly and soldering of the hybrid circuit on a substrate, the two support surfaces of each terminal pin form a support plane coplanar to this substrate. These terminal pins have, besides this, a fixation portion between their two longitudinal ends which runs parallel to the support plane, i.e. elevated with respect thereto. Means are provided to secure the hybrid circuit on the respective fixation portion perpendicularly to the support plane so that, in the assembly and soldering of the hybrid circuit, the portions extending laterally to the hybrid circuit—those portions with the support surfaces—form a support base of the terminal arrangement.

Due to the construction of the terminal pins of the present invention, two lateral portions and a bridge-shaped, elevated central portion, wherein terminal pin and perpendicularly rising hybrid circuit typically have together an inverted T shape. On the one hand, the hybrid circuit stands on the substrate of itself without further means of assistance and can be soldered. On the other hand, the bridge-shaped construction effects a sufficient elasticity and carrying capacity relative to swivellings, or respectively, accelerations, as well as effecting the presence of two defined support surfaces whose co-planarity is guaranteed, not least by the springing configuration of the terminal pins.

Additional features and advantages of the present invention are described in, and will be apparent from, the detailed description of the presently preferred embodiments and from the drawings.

BRIEF DESCRIPTION OF THE DRAWINGS

FIG. 1 illustrates a perspective view of an embodiment of a terminal arrangement with a hybrid circuit.

FIG. 2 illustrates a perspective view of an embodiment of a terminal arrangement with a hybrid circuit.

DETAILED DESCRIPTION OF THE PRESENTLY PREFERRED EMBODIMENTS

A terminal arrangement is depicted in FIGS. 1 and 2 and is often called a terminal comb. The terminal arrangement has a number of terminal pins 2 manufactured from a plate bent stamping part. The pins 2 are not, however, necessarily arranged in pairs. The hybrid circuit 1 can, as depicted, be clamped in between teeth or tines which are bent up so that it is as a whole arranged perpendicular to the common support plane of the terminal pins and thus perpendicular to the plane of the substrate, or respectively, of the printed circuit board. As shown in FIG. 1, two thermal releases 8 on the hybrid circuit 1 are depicted, while the remaining discrete elements, or respectively, the existing film structures, are not depicted. For reasons of simplicity, FIG. 2 likewise merely indicates an abstract element space 9 on both sides of the hybrid circuit 1.

A hole contour 7 arising through the tooth formation as shown in FIG. 1 positively affects the soldering flow in the soldering of support surfaces 3 and 4. As a result, soldering joints arise which are substantially free of bubbles and are thus maintainable. The number of the terminal pins 2 is directed primarily according to the number of poles of the hybrid circuit 1 since the stability of the support base is usually guaranteed already by two terminal pins that are positioned so as not to be too closely adjacent. The dimensions of the lateral portions are essentially not critical; they can equal about 8 mm×0.9 mm given hybrid circuit dimensions of a few centimeters, for example. According to space requirements on the substrate, the lateral portions with the support surfaces 3 and 4 can be more or less shortened at one or both sides by cutting. If the support base is guaranteed by at least two whole terminal pins 2, then the individual terminal pins 2 may also be configured with a support surface which is present only on one side. Besides this, it is possible to additionally fixate the terminal arrangement in assembly and soldering through a bonding point set beneath the fixation portion 5.

With the terminal arrangement of the present invention, the required electrical parameters with reference to current load and contact resistance can be achieved without further ado. The construction technology of the hybrid film and of the solder on the hybrid circuit itself are configured such that they withstand the increased stress in SMD assembly. From the standpoint of production technology, the terminal arrangement is suitable for industrial scale. The corresponding hybrid circuits, which are very versatile, e.g. they can be used in a resistance network or in an AC/DC converter, can be assembled and soldered out of the package completely and automatically.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

We claim:

1. A terminal arrangement for an SMD-capable hybrid circuit, the arrangement comprising:

at least two essentially rectangularly planar terminal pins configured as metallic bent stamped parts wherein terminal pins respectively have at their two longitudinal ends a portion designed as a support surface wherein, in assembly and soldering of the hybrid circuit on a substrate, the two support surfaces of each terminal pin form a support plane coplanar to this substrate and further wherein the terminal pins have a fixation portion between their two longitudinal ends running parallel to the support plane; and means for fixating the hybrid circuit on the respective fixation portion perpendicular to the support plane such that, in the assembly and soldering of the hybrid circuit, the portions extending laterally to the hybrid circuit form a support base of the terminal arrangement.

2. The terminal arrangement according to claim 1 wherein the portions are constructed variably long according to space requirements on the substrate.

3. The terminal arrangement according to claim 1 wherein in the assembly and soldering on the substrate, the terminal arrangement may be additionally fixated through a bonding point emplaceable beneath the fixation portion.

* * * * *